United States Patent
Otto

(10) Patent No.: US 9,859,039 B2
(45) Date of Patent: Jan. 2, 2018

(54) MULTIFILAMENT SUPERCONDUCTING WIRE WITH HIGH RESISTANCE SLEEVES

(71) Applicant: Alexander Otto, Groton, MA (US)

(72) Inventor: Alexander Otto, Groton, MA (US)

( * ) Notice: Subject to any disclaimer, the term of this patent is extended or adjusted under 35 U.S.C. 154(b) by 100 days.

(21) Appl. No.: 15/043,087

(22) Filed: Feb. 12, 2016

(65) Prior Publication Data

US 2016/0260526 A1    Sep. 8, 2016

Related U.S. Application Data

(60) Provisional application No. 62/116,173, filed on Feb. 13, 2015.

(51) Int. Cl.
    *H01B 12/10*    (2006.01)
    *H01L 39/14*    (2006.01)
    *H01L 39/24*    (2006.01)
    *H01B 13/00*    (2006.01)

(52) U.S. Cl.
    CPC ......... *H01B 12/10* (2013.01); *H01B 13/0016* (2013.01); *H01B 13/0036* (2013.01); *H01L 39/143* (2013.01); *H01L 39/248* (2013.01)

(58) Field of Classification Search
    USPC .......................................................... 74/72 R
    See application file for complete search history.

(56) References Cited

U.S. PATENT DOCUMENTS

| | | | | |
|---|---|---|---|---|
| 5,114,908 A | * | 5/1992 | Sato ....................... | H01B 12/06 174/125.1 |
| 5,276,281 A | * | 1/1994 | Sato ....................... | H01B 12/06 174/125.1 |
| 5,929,000 A | * | 7/1999 | Hahakura ............... | H01B 12/02 174/125.1 |
| 7,608,785 B2 | * | 10/2009 | Reis ....................... | H01B 12/06 174/125.1 |
| 2003/0024730 A1 | * | 2/2003 | Otto ....................... | H01L 39/143 174/125.1 |
| 2003/0032560 A1 | * | 2/2003 | Otto ....................... | H01L 39/143 505/100 |

FOREIGN PATENT DOCUMENTS

| | | |
|---|---|---|
| CH | WO9628853 A1 | 9/1996 |
| EP | 1868212 A  * | 12/2007 |
| EP | 1868212 A1 | 12/2007 |
| JP | 11111081 A  * | 4/1999 |
| JP | H11111081 A | 4/1999 |

OTHER PUBLICATIONS

International Search Report, PCT/US2016/017813, dated Apr. 2, 2016, International Searching Authority.
Written Opinion of the International Search Authority, PCT/US2016/017813, dated Apr. 2, 2016, International Searching Authority.

* cited by examiner

*Primary Examiner* — William H Mayo, III
*Assistant Examiner* — Krystal Robinson
(74) *Attorney, Agent, or Firm* — Porter Wright Morris & Arthur LLP

(57) ABSTRACT

Methods and devices involving 2212 multifilament superconducting wire with resistance sleeves. More specifically, methods and devices including high resistance sleeves around individual, unmerged filaments or filament bundles, with axial twist, and with round or rectangular wire shape for lower losses in and ramped fields.

20 Claims, 12 Drawing Sheets

115 μm across the merged filament bundle, with ~ 14 μm across prior distinct filaments 790 μm diameter wire

MULTIFILAMENT SUPERCONDUCTING WIRE WITH HIGH RESISTANCE SLEEVES

CROSS-REFERENCE TO RELATED APPLICATIONS

This application claims the benefit of provisional application 62/116,173, filed Feb. 13, 2015, the entire contents of which are hereby incorporated by reference.

TECHNICAL FIELD

This application relates generally to methods and devices involving producing a 2212 multifilament superconducting wire with resistance sleeves. More specifically it relates to methods and devices including high resistance sleeves around individual, unmerged filaments or filament bundles, with axial twist, and with round or rectangular wire shape for lower losses in and ramped fields.

BACKGROUND

High temperature superconducting (HTS) oxide based wires provide the opportunity for ground breaking advances in the field levels and performance of accelerator magnets, while greatly reducing their weight, size and power consumption. This is made possible by their extraordinarily high upper critical fields, flux pinning, transition temperatures, and critical current density in wire (Je).

There is now a specific need for HTS that can operate with low inductive loss at higher temperatures and current densities (Jop) in the time varying magnetic fields of advanced accelerators, generators and transformers. However, as yet, there is no HTS conductor with sufficiently small transverse filament dimensions, and elevated inter-filament resistances to attain the required low losses. As a result, the superior Je at high operating temperatures of present HTS conductors cannot benefit these applications until much lower loss HTS conductors are developed.

Methods and devices outlined herein address the long-felt need for HTS with superior properties. Outlined herein is a finding that among all candidate superconductors, only the 2212 round or rectangular wire can provide superior Je in field at higher operating temperatures while in principle enabling low loss features that are proven to work with low temperature superconductors (LTS).

SUMMARY

Embodiments described herein provide for methods of producing a 2212 multifilament superconducting wire comprising resistance sleeves, the method comprising: selecting a metal precursor to an oxide layer, the metal precursor being a precursor for each of the resistance sleeves for encasing a corresponding filament of a drawn multifilament wire; wrapping a first silver rod with the selected metal precursor and placing the first silver rod and the metal precursor into a silver tube comprising a multi-holed first billet; wrapping at least a second silver rod with the selected metal precursor and placing the at least the second silver rod and the metal precursor into the silver tube comprising the multi-holed first billet; applying a first heat to the billet; producing the drawn multifilament wire by wire drawing the multi-holed first billet into a bundle rod that is a round shape or a hexagonal shape as viewed along a cross-section; cutting the bundle rod into segments longitudinally; placing at least two of the segments within a second billet comprising either pure silver or a silver alloy; drawing down the second billet to a final diameter; twisting the round-shaped wire or the hexagonal-shaped wire about a longitudinal axis to a pitch of about 20 centimeters or less; and applying a second heat to the round-shaped wire or the hexagonal-shaped wire to oxidize the metal precursor film, forming the 2212 multifilament superconducting wire comprising the resistance sleeves.

Additional embodiments described herein provide for a 2212 multifilament superconducting wire comprising resistance sleeves, the wire comprising: at least two filaments, each filament comprising 2212 regions separated from each other as seen on the wire cross-section; silver in between each of the 2122 regions and surrounding each of the 2122 regions; the resistance sleeves comprising an oxide, the resistance sleeves positioned between the silver and the 2122 regions such that each of the resistance sleeves surrounds one of the 2122 regions, the resistance sleeves extending substantially the entire length of each corresponding 2122 region.

BRIEF DESCRIPTION OF THE DRAWINGS

The embodiments set forth in the drawings are illustrative and exemplary in nature and not intended to limit the inventions defined by the claims. The following detailed description of the illustrative embodiments can be understood when read in conjunction with the following drawings, where like structure is indicated with like reference numerals and in which:

DETAILED DESCRIPTION

Figure 1:
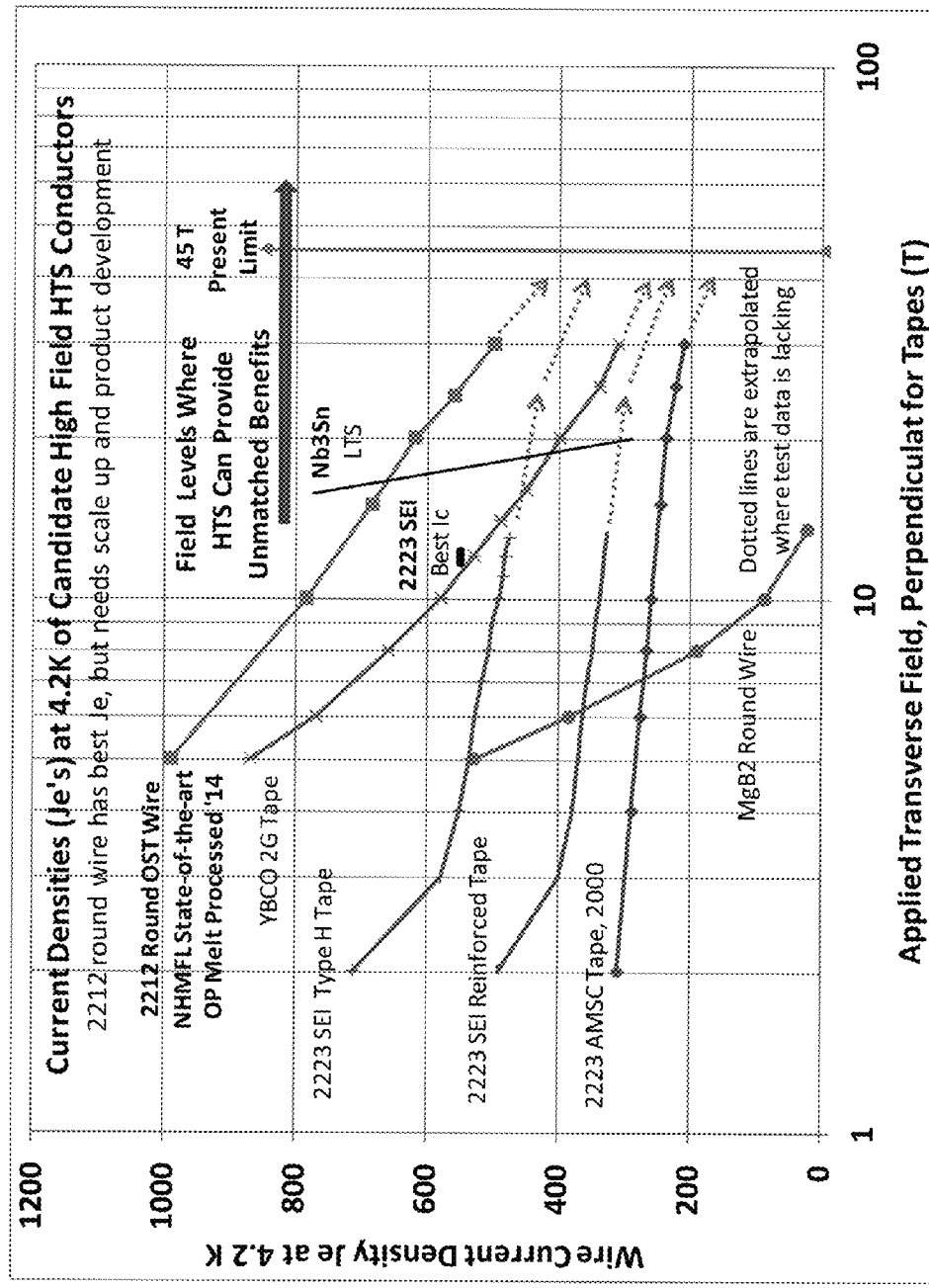
FIG. 1. Illustrates a graph of wire current density versus applied transverse field, demonstrating the current density superiority of 2122 wire.

Specific embodiments of the present disclosure will now be described. The invention may, however, be embodied in different forms and should not be construed as limited to the embodiments set forth herein. Rather, these embodiments are provided so that this disclosure will be thorough and complete, and will fully convey the scope of the invention to those skilled in the art.

Unless otherwise defined, all technical and scientific terms used herein have the same meaning as commonly understood by one of ordinary skill in the art to which embodiments of this invention belong. The terminology used herein is for describing particular embodiments only and is not intended to be limiting of the invention. As used in the specification and appended claims, the singular forms "a," "an," and "the" are intended to include the plural forms as well, unless the context clearly indicates otherwise.

Unless otherwise indicated, all numbers expressing quantities of ingredients, properties such as molecular weight, reaction conditions, and so forth as used in the specification and claims are to be understood as being modified in all instances by the term "about," which is intended to mean up to ±10% of an indicated value. Additionally, the disclosure of any ranges in the specification and claims are to be understood as including the range itself and also anything subsumed therein, as well as endpoints. Unless otherwise indicated, the numerical properties set forth in the specification and claims are approximations that may vary depending on the desired properties sought to be obtained in embodiments of the present invention. Notwithstanding that numerical ranges and parameters setting forth the broad scope of embodiments of the invention are approximations, the numerical values set forth in the specific examples are reported as precisely as possible. Any numerical values, however, inherently contain certain errors necessarily resulting from error found in their respective measurements.

Parts of methods described herein such as mathematical determinations, calculations, inputting of data for computations or determinations of equations or parts thereof can be performed on parts of or one or more computers or computer systems that can include one or more processors, as well as software to run or execute programs and run calculations or computations.

Methods and systems and parts thereof described herein can be combined so as to implement embodiments of the invention. Forms of words used herein can have variations: for example when a word such as "calculate" is used, this implies that variations such as "calculated" and "calculating" are understood and have been considered.

The low loss 2212 superconducting wire can have a cross-sectional area of between about 0.1 square millimeters and about 3 square millimeters and can have a cross sectional shape that is about round, square, oval, hexagonal or rectangular with a shape aspect of less than 4:1. In specific embodiments the cross-sectional area is between about 0.05 to about 0.15 square millimeters and about 2.5 to about 3.5 square millimeters.

In its fully reacted form it is comprised of many 2212 "filaments" that are inside a high resistance enclosing sleeve as will be described below. Each "filament" may consist of a single 2212 region, or many partially or fully separated filament regions as seen on a wire cross-section, and elongated along the wire length and with silver in between and intermixed. The area fraction of silver may range from about zero to about 50 percent in the filament bounded by the outer limits of the 2212 material comprising this filament (in specific embodiments, for example about zero to about 20 percent or from about 20 to about 50 percent). The 2212 is also in a melt textured and reacted form with an oxide critical current density of at least 50 kA/mm2 at 4.2 K in 5 T perpendicularly applied magnetic field.

The region outside the 2212 oxide-silver is comprised of the high resistance sleeve. The effective resistivity of this sleeve is, in specific embodiments, greater than 0.0001 ohm cm at ambient temperature as well as from about 78 K to about 2 K.

The sleeve is, in specific embodiments, comprised of one or more of several parts, including silver containing at least 0.1 volume percent of a finely dispersed oxide, or at least 0.05 percent of the metal in the oxide; for example in specific embodiments this can be at least one of $Al_2O_3$, MgO, LiO and the like, with oxide particle size below about 1 micrometer. The sleeve also can contain one or more thin oxide layers that enclose at least 90 percent of the filament, and that are less than about 3 micrometers thick each (such as 1 micrometer thick, 2 micrometers thick, or from about 1 to about 2 micrometers thick). The high ODS Ag sleeve is preferably located outside of the first inner oxide layer, and may comprise the matrix all the way to the sleeve around neighboring filaments, as well as to the wire surface, or there may be another composition of silver between the sleeves of each filament. However, the sleeve, comprised of the metal oxides layers and high ODS silver can exceed 5 micrometers in thickness everywhere around the filament (such as from about 6 micrometers to about 8 micrometers, or from about 5 micrometers to about 10 micrometers)

The filaments in the wire are also arranged in a helix along the wire axis, with the repeating period of the helix at, in specific embodiments, less than 20 cm, less than 5 cm, or less than 2 cm.

The 2212 filaments are also formed so as to avoid growth of the 2212 plate shaped grains such than on any 10 random cross-sections at least 1 mm apart on the wire length, there is less than the total number of filaments/200 regions where a 2212 grain spans the gap between filaments and occupied by the two sleeves between them.

Production of the Above Described Structure

The oxide layer(s) can be made from metal precursors to the oxide, for example an Al—Li, Al—Mg, Al—Ca and like alloy, or just a high purity Al alloy, or in the case of Mg a pure Mg or Mg—X alloy. The as drawn multifilament wire can be produced by wire drawing, with the metal precursor ductility approximately matching the ductility of the relatively pure silver inside the precursor filament regions, and the ODS silver prior to its oxidation.

Further, the metal precursor layer can be introduced by wrapping a very clean silver tube or rod with the alloy precursor to the oxide layers, placing these into a silver tube and consolidating the three components by a combination of deformation and heat to attain metallurgical bonding.

This tube is the billet into which the mono of multi-region "filament" can be bundled. This structure can be drawn down into another bundle rod, that can be drawn to a round or hex rod. This rod can be then cut and bundled into a final billet comprised of either pure Ag or an Ag alloy similar to what is in the sleeve.

After drawing down to final diameter, the round wire can be twisted about its axis to a pitch of about 20 cm or less; in specific embodiments, to a pitch of from about 0 to about 10 cm, and in specific embodiments from about 0 to about 5 cm.

The metal precursor film formed from the foil can be about 0.1 to about 2 micrometers in thickness in the final sized wire. After the wire is drawn and twisted, it can in specific embodiments be further formed into a square or rectangular wire. The metal precursor film can then be oxidized by raising the wire temperature into the 300 C to 650 C range in an oxygen gas containing environment, for example with oxygen present with a partial pressure of about 0.2 atm to about 20 atm. In specific embodiments the temperature is from about 300 to about 400 degrees Celsius, and in others, about 400 to about 500 degrees Celsius, and in others about 500 to about 650 degrees Celsius. In specific embodiments the oxygen partial pressure is from about 0.2 to about 5 atm, and in others from about 0.2 to about 10 atm. At these conditions oxygen diffuses rapidly into the sliver while the reactive element the will for the dispersed oxide particles cannot diffuse fast enough to form large particles.

During this oxidation step, the metal films are also oxidized, by a combination of oxygen coming in from the wire surface and in some cases also from oxygen that has been pre-loaded into the pure silver between and (in specific embodiments immediately) surrounding each filament. This oxygen preloading can be accomplished by placing a relatively high purity silver billet into which the powder will be packed, into oxygen at up to 20 atm and a temperature in the range of 400 C to 900 C for long enough to allow oxygen diffusion into the billet, thereby loading it up for subsequent oxidation of the film inner interface with the filament silver. In specific embodiments the temperature is from about 400 to about 600 degrees Celsius, and in others, about 600 to about 900 degrees Celsius. In specific embodiments the oxygen partial pressure is from about 0 to about 5 atm, and in others from about 0 to about 10 atm. This step can avoid excessive depletion of oxygen from the 2212. The formation of this thin oxide layer at the inner side of the foil from oxygen that does not deplete the 2212 filaments oxygen is significant for avoiding depletion of the oxide from 2212 and impairing the likelihood of converting it to high current density 2212. Thereafter the oxidation of the ODS alloy and outer parts of the films may be completed without depleting oxygen from the 2212 filaments.

Another method for loading the silver with an oxygen source is to use a silver copper alloy for the mono filament billet, which before packing with powder is subjected to an oxidation treatment that forms copper oxide dispersed particles. These particles, if larger than about 0.2 um in size allow the silver to retain its ductility in wire production, Upon oxidation, the Copper in the oxide in the silver is reduced to lower valence form, giving up oxygen and allowing oxidation of the filament sides of the films. In specific embodiments the particles are from about 0.2 to about 0.5 micrometers in size.

Identification and Significance of a Problem or Opportunity, and Technical Approach As indicated previously, among all candidate superconductors, only the 2212 round or rectangular wire can provide superior Je in field at higher operating temperatures while in principle enabling low loss features that are proven to work with low temperature superconductors (LTS). This is because multifilament as-drawn 2212 wire is melt texture-processed into high Jc sintered 2212 filaments without requiring deformation that would damage or alter precursors to low loss features introduced in the matrix earlier in the process. As a result, the combination of small (less than 30 um) filaments, optimally elevated inter-filament resistances and axial twist to suitably reduce loss can be built into the architecture before wire drawing and, with our proposed adaptation of the melt texturing process and wire architecture, result in low loss 2212 wire and cable.

8.1.1 2212 as Compared to Other HTS Options

Each conductor embodiment under development presents challenges and opportunities for meeting requirements.

(1) Wide, thin "2G" tape with epitaxial textured 123 $((Re)Ba_2Cu_3O_{7-\square})$ monofilament film produced by about 10 companies.

(2) Wide, thin "1G" tape with rolled, solid state reaction textured and sintered $2223(Bi_2Sr_2Ca_2Cu_3O_x)$ merged filaments in a silver matrix made by Powder in Tube (PIT) by Sumitomo Electric Industries.

(3) Round/rectangular wire with sintered $MgB_2$ filaments made by PIT primarily by Columbus Superconductors and HyperTech.

(4) Round/rectangular wire with melt textured 2212 $(Bi_2Sr_2Ca_1Cu_2O_y)$ filaments in a silver matrix made by PIT mainly by Oxford Superconductor Technology (OST), but also SupraMagnetics and Supercon.

Wide and thin HTS tapes are poorly suited for solenoid coils, ramped field conditions, and some large magnets. For these, round or rectangular multifilament 2212, $MgB_2$ and $Nb_3Sn$ wires provide options for solutions beyond the cabling and field ramp loss limitations of tapes. Recent advances at the Applied Superconductivity Center (ASC) of the National High Magnetic Field Laboratory (NHMFL) on over pressure (OP) melt texturing have also demonstrated that 2212 wire can provide the best Je among all superconductors at high fields as seen in FIG. 1.

Among round wire candidates, $MgB_2$ like $Nb_3Sn$ also loses its ability to carry current at the high fields and temperatures possible with 2212, making it unsuitable for higher field, higher operating temperature applications, despite the lower cost of its constituents. Although Je data for OP 2212 is still lacking at higher temperatures, its 78 K transition temperature compared to 18 K and 40 K for $Nb_3Sn$ and $MgB_2$ indicate that 2212 is poised to provide unmatched low loss wire performance above about 15 K.

FIG. 1. Wire Je's at 4.2 K of candidate superconductors for high field and low loss use, illustrate the Je superiority of 2212 in round wire form that can be adapted for use in high field magnets with low losses.

8.1.2 Multifilament Superconducting Wire Features for Attaining Low Field Ramp Loss Conditions In multifilament superconductors, time-varying magnetic fields induce voltages that drive three types of current loops and corresponding energy loss.

(1) Within the superconductor (hysteretic loss).
(2) Within the matrix material only (eddy current loss).
(3) Spanning the matrix from one filament to its neighbors (filament coupling loss).

These have been widely studied with LTS materials and to a limited extent with 2223 and 2G tape but as yet, not with high Jc OP 2212 wire. Quantitative modeling of loss in multifilament superconductors is complex. This research focuses in part on identifying the loss components in 2212 wire that must be reduced, and applying elements of approaches proven mainly with LTS.

The equation governing loss is given by Faraday's law of inductance (1), whereby an EMF is generated when a magnetic field is changed over time in an enclosed area orthogonal to the field direction.

$$\text{EMF in volts} = -A(dB/dt) \quad (1)$$

For the case of full field penetration in a closed loop with resistance R, and area A, energy dissipation rate (loss) is then given by equation 2 for magnetic field changing at a constant.

$$Q = V^2/R = (-A(dB/dt))^2/R \quad (2)$$

It is evident that for all loops, inductive loss is reduced by decreasing A, and increasing R. Initially for a loop within only the superconducting material, R=0. But a changing field very quickly generates a current around the perimeter of the material to its critical current density (Jc) resulting in R>0, and dissipated energy. This hysteretic loss can be mitigated through reductions in superconducting filament area. However, the degree of field penetration and the complex interplay between the non linear R of the superconductor and field make trends easier to predict than exact losses.

Although also quite complex, filament-coupling loss can be reduced by decreasing loop size with axial twisting of the wire to form helical filament geometries and with transposition of filament positions to decrease loop length along the wire axis. Loss can be further reduced by enclosing each filament in a higher resistance sleeve to reduce current flow between filaments over the twist/transposition pitch length. Transposed filaments are only practical for simple perimeter filament arrangements and so the best option is axial twisting combined with higher resistance between the filaments. Eddy current loss in the matrix is, in specific embodiments, the smallest and often insignificant contributor to loss. It may also be reduced by increasing matrix resistivity and by reducing the matrix region thicknesses.

The wide tape forms of 1G and 2G tapes present large in-plane superconducting loops and hysteretic loss can be very large, depending on magnetic field and HTS properties. For this reason, these HTS tapes are unsuitable for applications where field orthogonal to the tape surface is ramped beyond a certain rate.

8.1.3 Estimation of Filament to Filament Resistance for Twist Pitch

Figure 2:
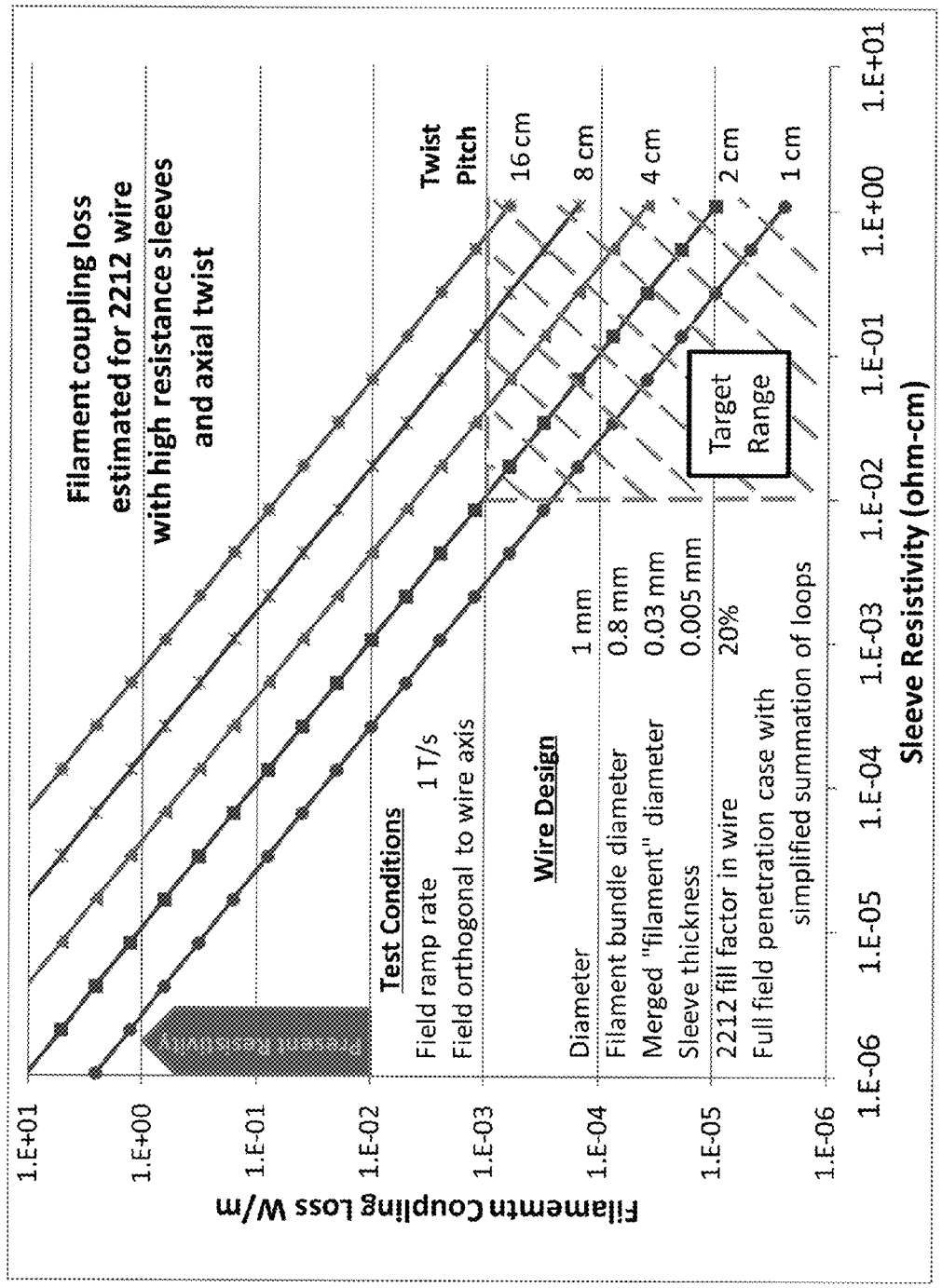
FIG. 2 illustrates filament coupling loss with increasing sleeve resistivity.

A full field-penetration solution of eq. 2 was used to estimate sleeve resistivity to reduce losses to a benchmark level with 2212 "filaments" sizes at the FOA target (in specific embodiments) of about 30 um, and wire diameter of about 1 mm, with axial twisting. The graph in FIG. 2 illustrates loss with increasing sleeve resistivity from the present $10^{-6}$ ohm cm to 1 cm combined with axial twist pitch to about 1 cm at a field ramp rate of about 1 T/s. Our proposed 1 mW/m benchmark for demonstrating feasibility is attained at about $10^{-2}$ ohm cm with a 2 cm pitch.

FIG. 2 Estimation of the loss in W/m for 1 mm diameter 2212 wire with axial twist from 16 cm to 1 cm and sleeve resistivity from $10^{-6}$ ohm cm to about 1 ohm cm, illustrating that a sleeve resistance of 0.01 ohm cm lowers loss below our Phase 1 benchmark 1 mW/m level with a 1 cm twist, and 1 T/s field ramp.

8.1.4 2212 Wire Production Process 2212 and Nb$_3$Sn multifilament processes are very similar. Precursor powder to the 2212 superconductor is packed into a silver container (billet) and sealed. This billet becomes the silver surrounding each filament in the multifilament wire. In order to make bundle rods, billet diameter can be reduced as its length is increased by pulling it through wire drawing dies, with anneals to soften the silver and prevent sheath damage. In final passes the rod shape is often changed to hexagonal. After cleaning, the rod can be cut into short rods that are stacked to form a hexagonal array comprised of for example 7, 19 or 37 rods. The stack is then inserted into a billet, sometimes with silver wires added to better fill the gaps. This billet can become the silver around each bundle of filaments in the wire. After sealing the billet can be again drawn into a rod and cut into segments that are stacked into bundles, packed and sealed into a billet. A final set of drawing steps can elongate this billet into a wire with a diameter in the about 0.8 mm to about 1.4 mm range. Other ranges include about 0.8 to about 1 mm, or from about 1 to about 1.2 mm.

The drawn wire can then cleaned and subjected to a heat treatment in which the powder precursor can be melted at high temperature (such as about 890 C, and in other embodiments from about 880 to about 900 degrees Celsius) and solidified slowly to form aligned and sintered 2212 grains capable of transporting electrical current at high densities. Multiple re-stack and draw sequences can produce the fine precursor filament structures (about 12 to about 20 um) believed to be required to attain high Jc. However the process that produces high Jc also presently introduces higher loss features into the wire.

8.1.5 the Sources of High Loss in Conventional 2212 Wire and Options for Lower Levels Current standard multi-filament 2212 wires contain features that increase loss. Most of these features are evident in the cross section of a typical 2212 melt textured wire presented in FIG. 3.

Figure 3B:
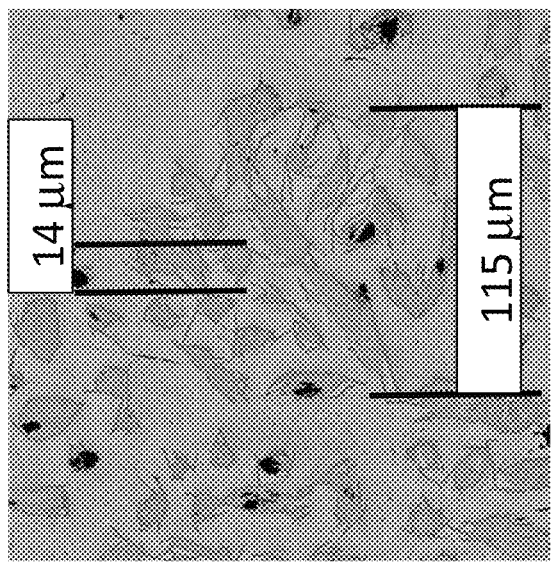
FIG. 3B illustrates a close up view of a filament merging and 2212 grain growth into the inter-filament silver to an about 10 um distance.
Figure 3A:
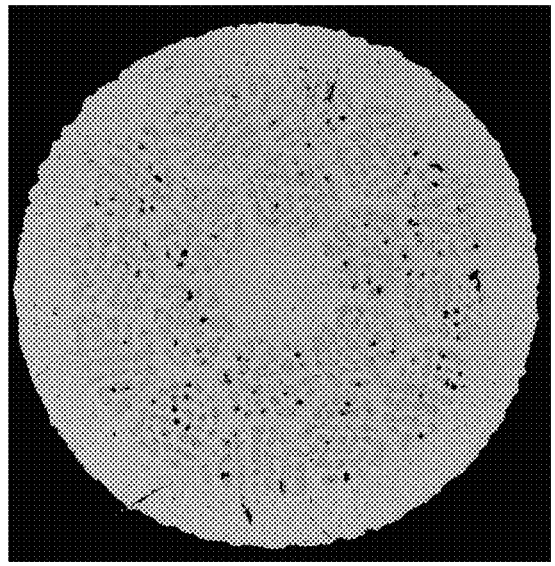
FIG. 3A illustrates a photograph of a cross section of 2212 standard wire produced and including melt texturing.

FIG. 3A—Photographs of cross section of 2212 standard wire produced by OST and OP melt textured at the ASC/NHMFL, and FIG. 3B, a close up illustrating filament merging and 2212 grain growth into the inter-filament silver to an about 10 um distance Merged 2212 Filaments that can Increase the Effective Transverse Filament Size.

With merging, 2212 grains span the silver matrix between filaments. Merging increases the effective size of the 2212 filaments, thereby increasing hysteretic loss. With enough merging, the filament bundle acquires the high loss characteristics of a monofilament. As seen in FIG. 3, the first bundle contains fully merged primary filaments of 12 to 20 um size that are separated by about 10 um of silver where they are not merged. 2212 grains grew to about 25 um, and often penetrated the silver to a distance of up to about 10 um, but in specific embodiments spanned the 25 um distance between filament bundles. Primary filaments 12 to 20 um in size that are close enough to merge were found to yield highest Jc's. Therefore merging in the first bundle is, in specific embodiments, likely required even in a low loss wire. However the full effect of OP melt-texturing remains to be tested and larger primary filaments may yield high Jc when melt textured by OP, enabling even lower loss in specific embodiments of the wire proposed here.

Causes of Merged 2212 Filaments Regions (a) Inhomogeneous deformation of the oxide particle filaments as the large diameter billet is drawn into a fine wire forms regions where filaments are very close together.

(b) Dissolution of silver matrix regions into the molten oxide during melt texturing treatment dissolves away the silver at already thinner regions. Upon solidification the silver precipitates back out from the melt, but not in a way that rebuilds the silver between merged filaments.

(c) Growth of off axis 2212 grains into the silver matrix to such large size that they reach the next filament. This misaligned growth may occur from 2212 nuclei forming in the melt at off axis rough interfacial regions between the powder and the silver, as well as from hard agglomerates of 2212 powder that in specific embodiments never melt completely and in specific embodiments provide nuclei for off axis 2212 grain growth.

Approaches to Reduce Merging (a) Use of small, uniform precursor powder without large agglomerates will reduce the occurrence of locally closer filaments as wire is drawn to small diameters. A uniform, agglomerate free powder that was developed by SMS in SBIR DE-0011334 can be used in this program to attain improved filament spacing uniformity in low loss wire.

(b) The impact of silver dissolution on merging will be investigated and, if found to be significant, can be mitigated by adding silver to the precursor powder to raise it to near its saturation level in the melt and/or by altering conditions such as oxygen pressure to reduce silver dissolution. It also possible, that silver dissolution provides a net benefit, by smoothing out the interface, thereby helping to reduce off axis 2212 grain growth.

(c) Growth of off axis 2212 can be reduced by use of the small sized precursor free from agglomerates described in a) above. Uniformly flowing small particle powder yields smoother interfaces between the silver and powder filaments, reducing the likelihood that off axis 2212 will nucleate at the silver interface and grow in that off orientation.

(d) Filament bundle silver thickness that exceeds the size of 2212 grains can be achieved by increasing spacing between filament bundles and by reducing 2212 grain size by melt texturing adjustments. Local composition variations and high carbon levels in present powder that lead to locally larger 2212 grains will also be improved by use of our powder. OP 2212 in FIG. 3 already displays smaller 2212 grains than grains formed in ambient pressure. Grain size can be assessed in 2212 samples produced by the ASC/NHMFL as part of their OP development program, in order to find conditions for the smallest 2212 grains where high Jc is still attained. 2212 fill factor in the first restack bundle will also be increased to the practical limit, and silver from there will be moved to increase the spacing between filament bundles, placing them out of range of merging.

(2) Large Inductive Loop Areas Between Filaments:

with filaments parallel to the wire axis along the wire's length, the enclosed area for any loop between superconducting filaments can be as large in area as the distance between the filaments and the approximate length of the wire.

Approach to Reduce Loop Size:

The loop sizes can be reduced by axial twisting of the wires. The limits of twisting can be determined with respect to loss, and trade-offs with Jc and onset of merging due to filament curvature. We have completed extensive work on the axial twisting of 2223 round wires, and possess an excellent basis for applying the same techniques to 2212 round wire. In specific embodiments described herein, wire can be round or about round (such as an oval), or square or about square (such as rectangular).

(3) Very Low Resistance Silver Matrix:

Resistivity of the silver matrix presently used to contain the 2212 is much lower than the levels for adequately reducing filament to filament current flow even for the smaller loops that will be present in wire with a 1 to 2 cm axial twist pitch.

Figure 4:
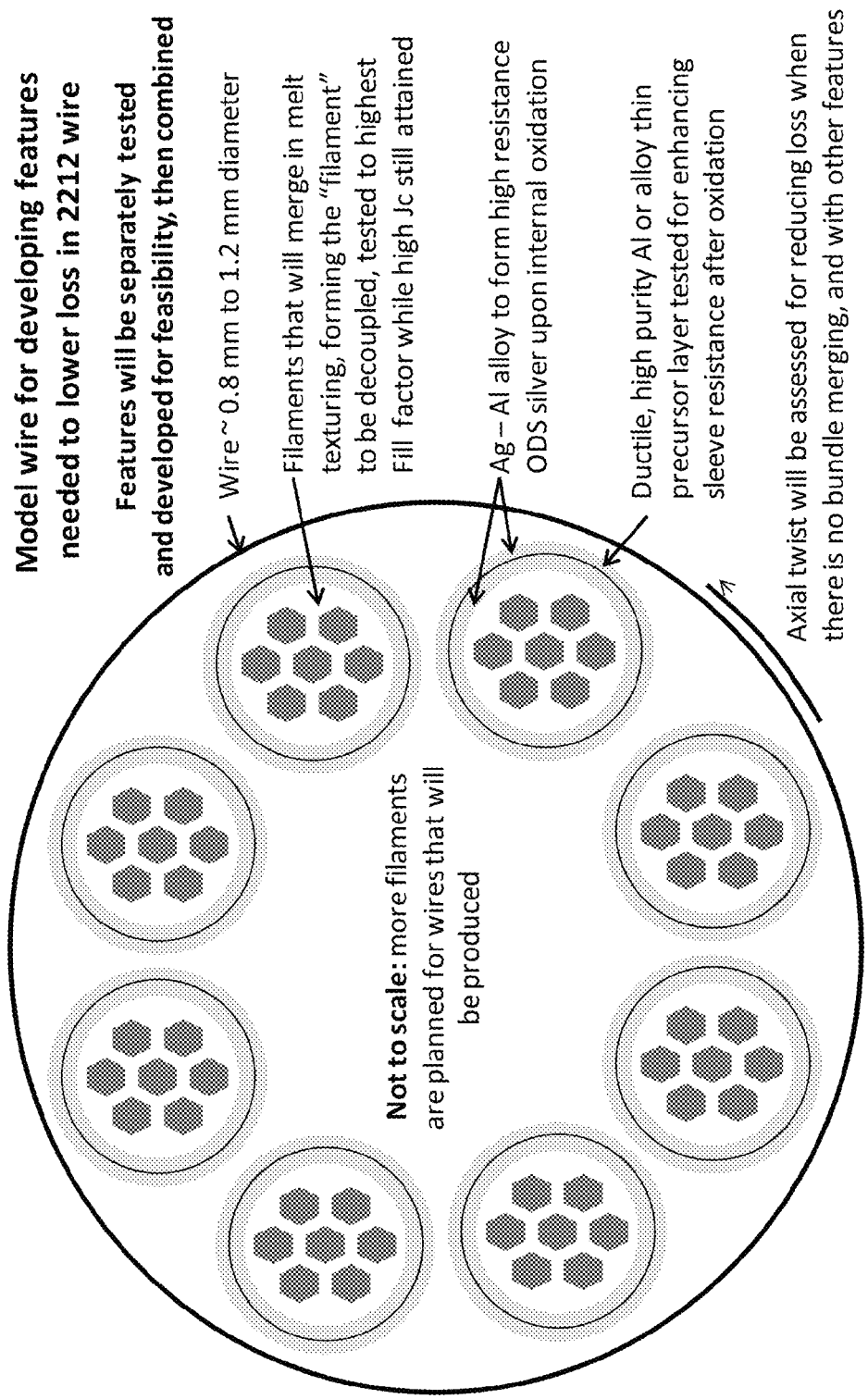
FIG. 4 illustrates a schematic of a model wire embodiment that will be used for developing much smaller, unmerged "filaments" (less than about 50 um) with lower hysteretic loss, as well as high resistance sleeves around each "filament" and axially twisting of the wire with the combined effect of lowering coupling loss.

Approach to Increase Filament to Filament Resistance:

The model wire embodiment in FIG. 4 can be used to develop a high resistance sleeve around each filament of the twisted wire while avoiding filament merging. The sleeve can comprise at least one of: 1) silver containing a high concentration of fine, dispersed oxide particles known to increase resistivity, and 2) a layer of very thin metal oxide with a relatively high oxygen diffusivity and additionally, with about 1 percent of its area containing perforation, that allows oxygen diffusion into and out of the enclosed filament during melt texturing.

FIG. 4. Schematic of the model wire embodiment that will be used for developing much smaller unmerged "filaments" (less than about 50 um) with lower hysteretic loss, as well as high resistance sleeves around each "filament" and axially twisting of the wire with the combined effect of lowering coupling loss.

Figure 5:
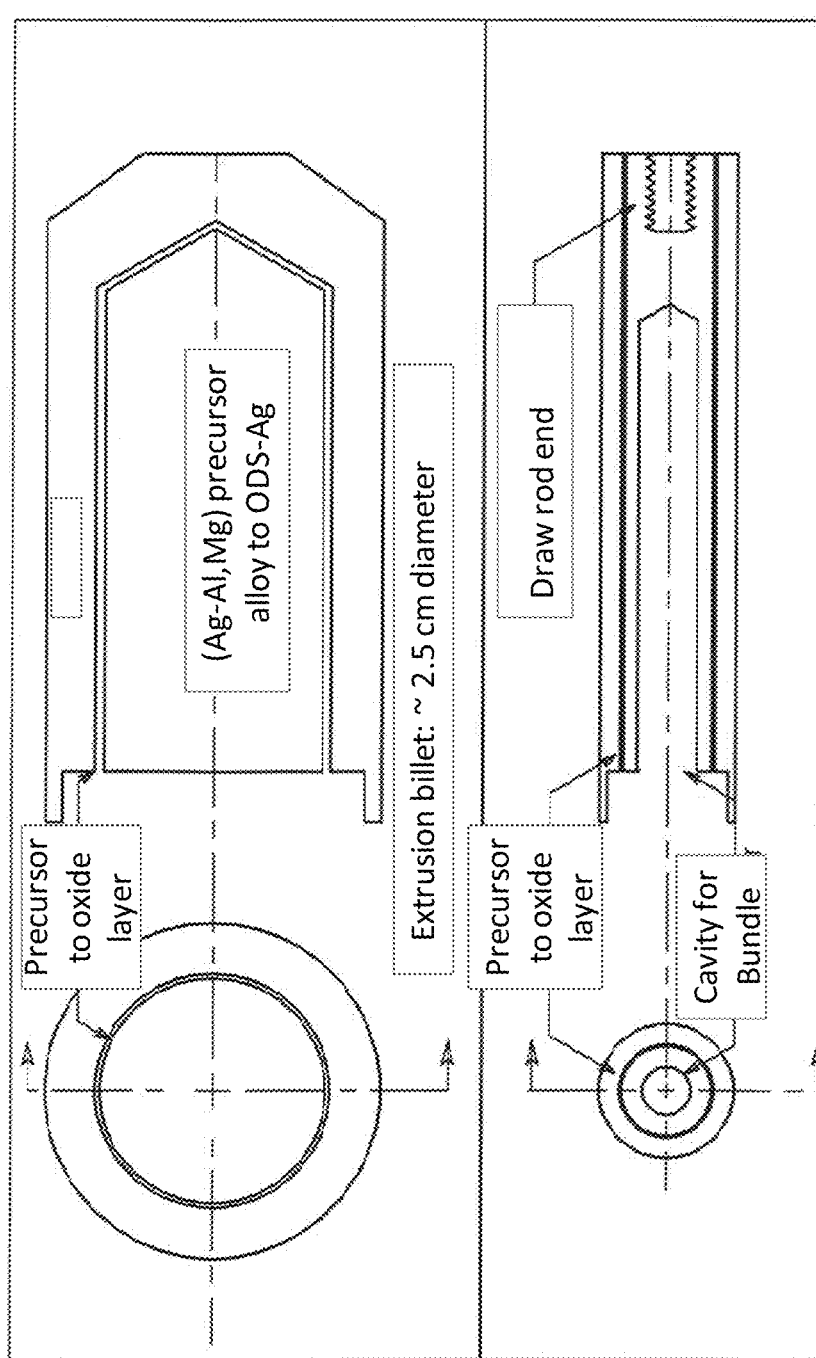
FIG. 5 illustrates an approach that can be used to produce the precursor sleeve billet into which the inner, high fill factor filament bundle will be inserted.

High resistance sleeves can start as ductile composite metal precursors to the dispersed and thin film oxides, thereby enabling extensive wire drawing without damage to the architecture. The precursor sleeve can be produced by a method we had also developed for 2223, with assembly of the clean sleeve and billet components as shown in FIG. 5, followed by consolidation deformation, diffusion bonding and drilling of the billet cavity. The filament bundle can then be inserted and sealed in this cavity, followed by wire drawing to form re-bundle rod with the sleeve precursor in its outer jacket.

Pieces of this rod will then be cut, cleaned, bundled and inserted into the multifilament wire billet, followed by sealing and drawing to form the final wire. This drawn wire can be twisted about its axis and used in experiments to establish melt texturing conditions that yield highest sleeve resistance and Jc, with lowest loss, as tested initially by magnetic methods.

FIG. 5 Depiction of the approach that can be used to produce the precursor sleeve billet into which the inner, high fill factor filament bundle will be inserted.

High resistance in the ODS and film sleeve components will be attained by internal oxidation of the metallic precursor such that with melt texturing, high resistance sleeves remain around each 30 um across "filament", that is comprised of 7 merged filaments. The results from model wire experiments will be applied to produce a multifilament wire of the kind illustrated in FIG. 6 in order to establish the feasibility of transferring the loss features to higher fill factor wire with multiple layers of approximately 30 um filaments.

Figure 6:
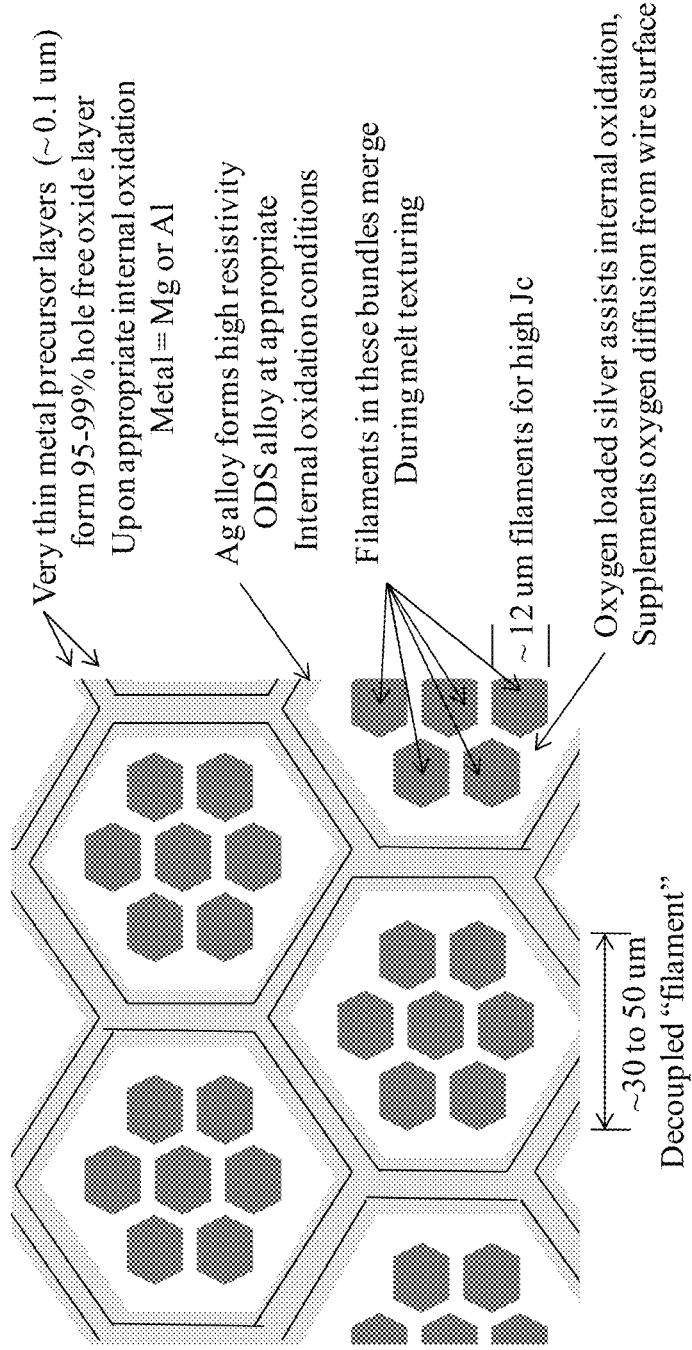
FIG. 6 illustrates a schematic of the precursor architecture to low loss 2122 wire.

FIG. 6 Illustration of precursor wire features developed by the model wire approach as they are built into high-filament count and high Je 2212 wire, similarly to low loss LTS wire architectures.

8.1.6 Application of Our Small Scale 2212 Wire Capability to the Development of Low Loss 2212 Wire In a project funded in 2014 by Phase 1 SBIR award DE-0011334, we developed a small scale, low-cost wire capability for 2212 that is now available for use in many 2212 development areas, including this project. The process map in FIG. 7 describes our small scale 2212 wire capability as adapted to in specific embodiments of this project.

Figure 7:
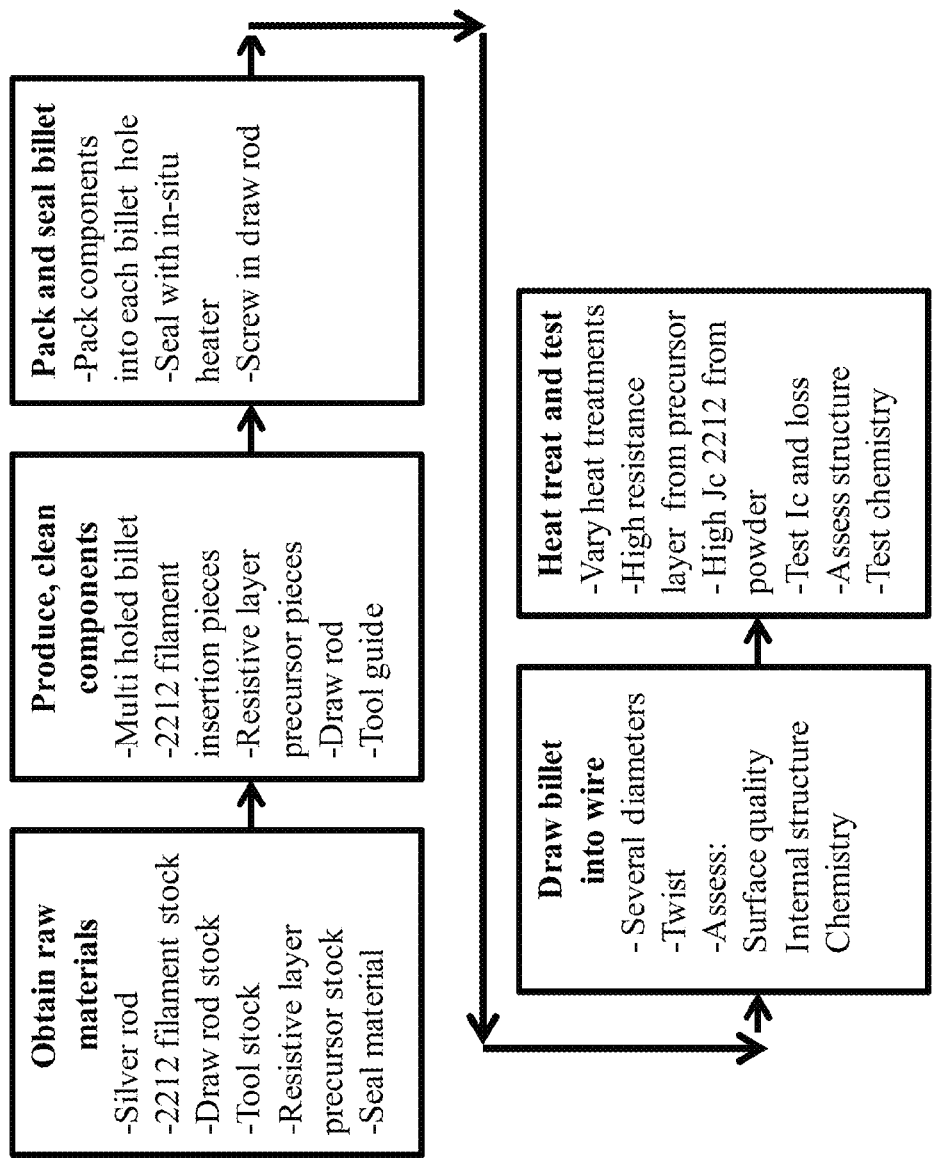
FIG. 7 illustrates a process map for a small scale 2212 wire approach adapted to demonstrate feasibility of lower loss 2212 wire by developing unmerged filaments, high resistance inter-filament sleeves and axial twisting.

FIG. 7 Process map of our small scale 2212 wire approach, in specific embodiments, adapted to demonstrate feasibility of lower loss 2212 wire by developing unmerged filaments, high resistance inter-filament sleeves and axial twisting.

A non-limiting objective of developing the small scale 2212 wire process was to enable low cost rapid production of high quality wire for studying the effect of powder and upstream wire attributes on final wire properties. These studies, in specific embodiments, can require many parameter variations with one wire per variation to identify useful correlations, while requiring only enough wire length to allow samples to be produced and tested. The process we established can utilize a small, inexpensive silver billet with drilled holes for each filament in the multifilament structure and uses a small amount of 2212 that is packed directly into a multifilament format and drawn in one sequence to wire, without requiring multiple draw and bundle steps.

Overview of Small Scale Capability.

Figure 8D:
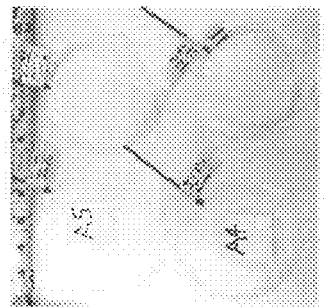
FIG. 8D illustrates wires at different sizes.
Figure 8C:
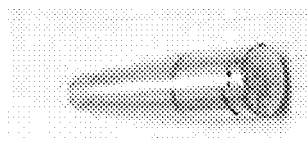
FIG. 8C illustrates an example of a sealed ready to draw billet.
Figure 8B:
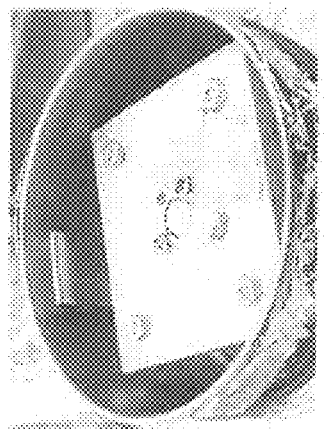
FIG. 8B illustrates packing and sealing equipment.
Figure 8A:
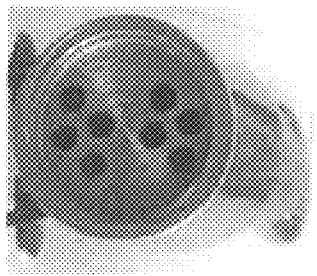
FIG. 8A illustrates a generic subscale billet.

We have developed the billet embodiment shown in FIG. 8 (A) and the packing and sealing equipment shown in FIG. 8(B) for our small scale wire capability. A typical sealed billet and drawn 4 m lengths are shown in FIGS. 8 (C) and (D). For this program, similar billets with different configurations can be produced according to the model wire embodiment shown in FIG. 4 with use of multifilament 2212 bundle rods, as well as precursor materials to the higher resistance sleeves.

FIG. 8: Generic subscale billet (A), Packing and sealing equipment (B), example of a sealed ready to draw billet (C) and drawn wires at different sizes (D).

8.1.7 Related Work Showing the Feasibility of Producing Thin Oxide Films with PIT 2223

In a partially completed program on low loss 2223 wire, methods were developed by the PI, for producing thin, high resistance, oxygen permeable films that were shown to be compatible with our chemistry.

Figure 9A:
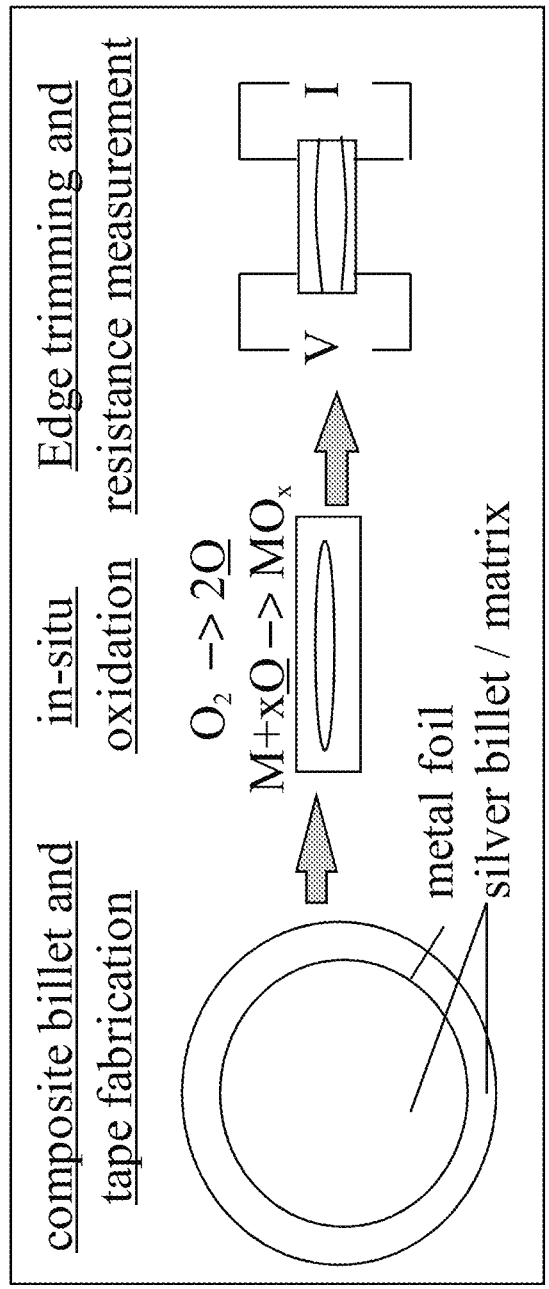
FIG. 9A illustrates the method used to make and test resistance through thin, in situ formed oxide films in silver.
Figure 9B:
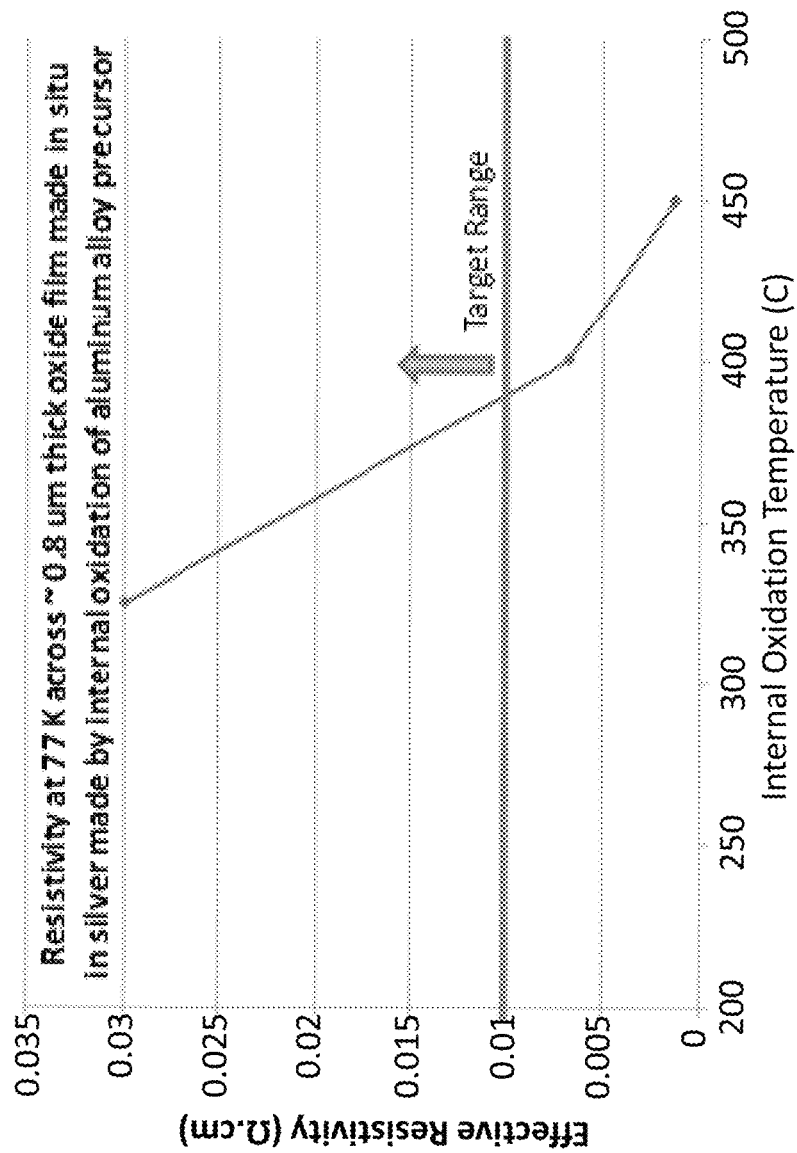
FIG. 9B illustrates resistivity data for 0.8 um thick $Al_2O_3$ film from approximately 0.5 um metal.

The billet design in FIG. 5 was developed and used to produce samples for oxide film formation and low loss 2223 wire development. Tape was produced with different thicknesses of aluminum-alloy foils. Oxidation studies were completed and samples tested for resistance through the oxide films as shown in FIG. 9 (A). A typical result in FIG. 9(B) illustrates that effective sleeve resistance in the oxide sleeve approach can reach the 0.01 to 1 ohm cm range targeted in this project for sub micrometer thick films.

Figure 10A:
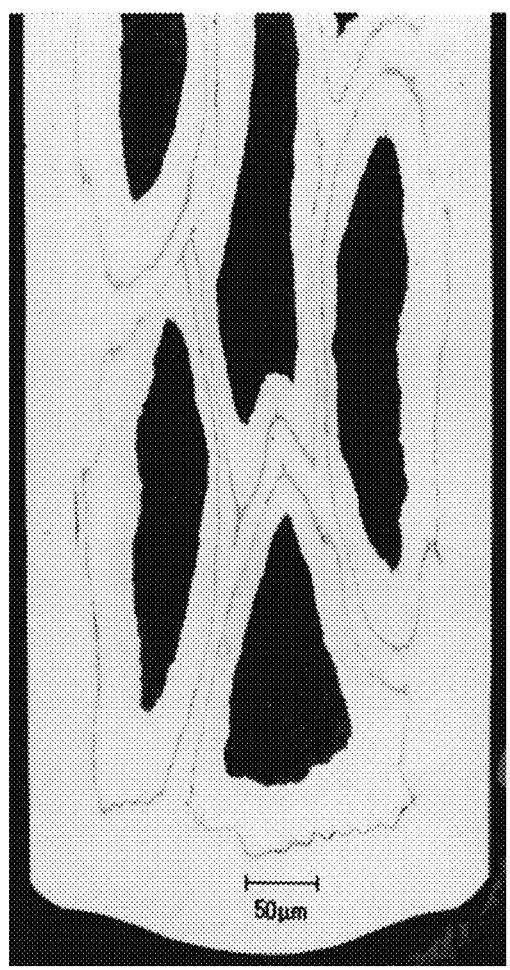
FIG. 10A illustrates a cross section of a 7 filament model 2223 wire with film sleeves around each filament in the as drawn metal precursor state.
Figure 10B:
FIG. 10B illustrates a cross section of a 7 filament model 2223 wire with film sleeves around each filament after internal oxidation and reaction. Jc was about 1 kA/mm$^2$ at 4.2 K, and I-V data exhibited resistive legs indicating high resistance in the sleeves.

Wires were also produced with metal film precursors. A drawn sample displays uniform submicron films in FIG. 10(A). A fully processed form in FIG. 10B displays films that have been converted to approximately continuous oxide with Jc's that were within 50 percent of developed 2223 tape. With the process and chemical similarity of 2212 to 2223, these data highlight the opportunity in this project for demonstrating low loss 2212 wire by building on our experience with low loss PIT 2223 wire development.

FIG. 9 Illustration of (A) the method used to make and test resistance through thin, in situ formed oxide films in silver and (B) resistivity data for 0.8 um thick $Al_2O_3$ film from approximately 0.5 um metal (From A. Otto).

FIG. 10. Cross section of a 7 filament model 2223 wire with film sleeves around each filament (A) in the as drawn metal precursor state, and (B) after internal oxidation and reaction. Jc was about 1 $kA/mm^2$ at 4.2 K, and I-V data exhibited resistive legs indicating high resistance in the sleeves.

8.2 Anticipated Public Benefits

Small scale capability can be established and feasibility validated in Phase 1 for adding loss reducing features to 2212 high Je wire for attaining the low losses required for producing higher performance accelerator, generator and transformer magnets that operate with ramped or ac field conditions. This can serve as the basis for a pilot unit operation in Phase 2 capable of producing long lengths of practical, low cost, low loss superconducting wire with superior in field Je and higher operating temperature capability.

Specific applications that can benefit from low loss 2212 wire and its cabled forms include 1) The Muon Collider Program that is a cornerstone of US High Energy Physics research, 2) Large accelerator-related magnets used at for example CERN 3) Advanced >1 GHz NMR system used for medical research, 4) Research magnets for studies above 25 T with faster field ramp capability, 5) Higher operating temperature, higher field magnets for fusion development, and 6) Lower weight, higher powered, more efficient wind generators and transformers for reduced emissions of green house gas pollutants.

Required quantities of 2212 wires are likely to increase rapidly over the next three to five years as 2212 wires and cables with compelling properties are integrated into large scale prototype development programs, and subsequently into superior commercial high field magnets and their applications. The Phase 1 program will advance the foundation for low cost, high quality commercial production of uniquely low loss 2212 based superconductors that will, after Phase 2 is completed, supply a superior conductor for these development programs and the resulting commercial end user products.

8.3 Non-Limiting Technical Objectives (1) Factor of Two or Greater Loss Reduction in 2212 Wire Via Axial Twisting and Unmerged Filaments Demonstrate the feasibility of unmerged <50 um 2212 "filaments" with axial twist, Jc (4.2K, 5 T)>2 $kA/mm^2$, and loss ~halved as compared to untwisted wire of similar Jc and design.

(2) Metal Precursor Sleeve Architecture in Drawn Wire with ~30 um Sized Effective Filaments As-drawn model wire architectures consisting of continuous, sub micrometer thick precursor metal films to the oxide films, and a highly alloyed silver sleeve around each precursor filament.

(3) ODS and Oxidized Film High Resistance Sleeves with Axial Twisting and High Jc 2212

Oxidized ODS and metal film sleeve layers around 2212 filaments with Jc >1.5 $kA/mm^2$ in 5 T, and resistivity in the layer in excess of 0.001 ohm cm.

(4) Low loss from high resistance sleeve combined with axial twisting

Demonstrate the feasibility of reducing loss by an additional factor of 2 with resistive sleeves around each filament, in combination with axial twisting and with Jc >1.5 $kA/mm^2$ at 4.2K in 5 T.

(5) Low loss features applied to high fill factor wire with validation of useful Je Demonstrate the feasibility of 2212 wire with Je(4.2K, 5 T)>300 $A/mm^2$ with <2 cm twist pitch and sleeves with >0.001 ohm cm, reducing loss as compared to wire without these features.

8.4 Work Plan

TASK 1, Non-Limiting Objective 1: Loss Reduction in 2212 Wire Via Axial Twisting and Unmerged Filaments Billet stock can be purchased and produced into small scale billets for model wires. High purity, uniform powder can be produced by our method. Conditions that produce high Jc with smallest 2212 grains, least silver penetration and merging will be identified and used to guide wire design. Wires (in specific embodiments at up to about 3 mm diameter and up to about 3 m lengths) each will be produced as shown in FIG. 4, but with more filaments and initially without sleeve precursors. Drawn wires will be quality tested in order to ensure that components and chemistries are present as planned. Wire sections will initially be twisted to pitch lengths of about 9 cm to about 0.7 cm.

Ambient pressure and OP melt texturing heat treatments will be completed at SMS and the ASC. Ic (4.2 K, self and 5 T field) can be determined by testing at the ASC and NCSU. Samples will be also examined in cross-section and longitudinally by quantitative metallography for data on merging. Based on these data, samples can be selected for field ramp/ac loss testing by a magnetization method.

The tested sample length tested can include at least two of the longest pitch lengths, within the capability of the test set up. As controls, loss will be tested on lengths of untwisted wire TASK 2, Non-Limiting Objective 2: Metal Precursor Sleeve Architecture in Drawn Wire with ~30 um "Filaments"

Silver alloy stock and precursor metal foils can be purchased. High fill factor mono cored bundle rods can be produced with high purity SMS powder. The stock in FIG. 5 for the sleeve billet will be designed and produced from clean components. After assembly the stock can be consolidated by deformation and diffusion bonding of the silver to the metal film. Sleeve billets can be produced from this stock and bundles of 7 mono cored filaments inserted into the cavities. After sealing, drawn bundle rods can be produced. Model wire bundle billets can then be produced, cleaned and packed with sleeve encased filament bundle rods. These billets can be drawn into wires of about 3 m in length each at three diameters determined in TASK 1 to be in an acceptable range for bundle spacing, and for "filament" sizes spanning 30 um. Based also on TASK 1 data, samples can be twisted to pitches in the range that yielded good results and they will be quality tested in order to ensure that their architectures and chemistries meet spec.

TASK 3, Non-Limiting Objective 3: ODS and Oxidized Film High Resistance Sleeves with Twisting and High Jc 2212

Model wires from Task 2 can be subjected to oxidation experiments based on methods described in FIG. 9. Extent and quality of oxidation can be assessed by weight gain and metallography. Internal oxidation treatments will take advantage of the high diffusivity of oxygen through silver at low temperatures, where 2212 is unaffected. Oxygen from the surface at 1 atmosphere diffuses rapidly towards the filaments, oxidizing first the dissolved reactive metal in the silver alloy, and then the aluminum in the film.

As a contingency, certain ductile aluminum alloys are known to oxidize quite rapidly while forming high resistance oxide layers. Such an alloy can be assessed in one model wire. A second contingency for increasing oxidation rate and minimizing depletive oxygen diffusion out of the 2212 filament to the ODS/Al layer, is to preload the pure silver within the filament bundle with oxygen. This can be accomplished by taking advantage of the unusually high solubility of oxygen in solid silver. If the 2212 chemistry and formation of high Jc filaments are found to be degraded in first round results, then a model billet can be constructed in which the non ODS silver components are preloaded with oxygen by heat treating the silver stock in gaseous oxygen at about 1 atm or greater for a period of time.

In specific embodiments, samples with promising structures can be selected and put through ambient pressure and OP melt texturing treatments primarily at SMS and with some samples provided to ASC for OP test runs. These melt textured samples can be tested for Ic (4.2K, self and 5 T perp field).

As part of sample preparation for Ic testing, the sample ends can be polished to remove the low resistance silver that smears across the sleeve layers. This way, the I-V data from the Ic test will show a resistive leg from the voltage required to drive the large electric currents through the high resistance sleeves of short samples with short current transfer lengths from the wire surface to each filament. This testing approach and the analysis method for estimating sleeve layer resistance from I-V data has been developed and used very effectively by us in the past with 2223 low loss wire development. For all samples of interest, the effective resistivity of the sleeve layers can be determined by analysis of the I-V curves obtained from the Ic test data, and compared to our target levels of 0.001 ohm cm and 0.01 ohm cm.

TASK 4, Non-Limiting Objective 4: Low Loss from High Resistance Sleeve Combined with Axial Twisting The methods, process conditions, architectures and data from TASK 4, candidate wire samples can be produced for loss testing by magnetic methods. Based first round loss data, additional samples can be produced from the wire inventory. Loss data can be correlated to the microstructure, sleeve resistivity, axial twist, "filament" size, oxide Jc and wire Je. Microstructure characterization of samples can be completed by systematically imaging cross sections taken along one or more twist pitch lengths.

TASK 5, Non-Limiting Objective 5: Low Loss Features Applied to High Fill Factor 2212 Wire with Useful Je High filament count wires with a 2212 fill factor in the 15 to 20 percent range can be designed based on results from TASK 1 through 4. The architecture targeted is illustrated in FIG. 6. The approximately 1 mm diameter wire can contain about 300 "filaments", each about 30 um in diameter, and each enclosed in a resistive sleeve.

The wire can be twisted to a pitch length near the limit where degradation in loss or Jc commences. Two small-scale as drawn wire lengths are planned for this task at up to three wire diameters, with the primary diameter at about 1 mm. As-drawn samples will be axially twisted to 2 pitch lengths. Internal oxidation tested can be completed to identify the time to complete oxidation of the metal precursors around all the filaments located from the wires outer surface to its center. Larger batches of wire samples can then be oxidized at these conditions and used to complete a first series of melt texturing test runs. Samples will be Ic tested, with the resistive leg method described above to assess average sleeve resistivity.

Methods and devices herein can include applying a first and/or second heat second heat to raise the round-shaped wire or the hexagonal-shaped wire temperature to between about 400 degrees Celsius and about 900 degrees Celsius. Heating can be performed in an oxygen gas containing environment. In specific embodiments oxygen is present with a partial pressure from about 0.2 atm to about 20 atm. In specific embodiments the second heat further comprises raising the round-shaped wire or the hexagonal-shaped wire temperature to between about 300 degrees Celsius and about 650 degrees Celsius in an oxygen gas containing environment, and this can be performed with oxygen present with a partial pressure from about 0.2 atm to about 5 atm.

Methods and devices herein can include a step of twisting the round-shaped wire about a longitudinal axis to a pitch of about 20 centimeters or less comprises a pitch of from about 0 to about 5 cm.

Methods and devices herein can include selecting the metal precursor to the oxide layer comprises selecting aluminum, an aluminum alloy, magnesium, or a magnesium alloy. Methods and devices can also include selecting the metal precursor to the oxide layer by selecting at least one of Al—Li, Al—Mg, and Al—Ca.

In specific embodiments the 2212 multifilament superconducting wire has the resistance sleeves, wherein the effective resistivity of each of the resistance sleeves is greater than 0.0001 ohm cm at ambient temperature as well as from about 78 K to about 2 K.

In specific embodiments the 2212 multifilament superconducting wire has resistance sleeves comprised of silver containing at least 0.1 volume percent of a dispersed oxide. In specific embodiments the oxide is at least one of $Al_2O_3$, MgO, or LiO. In specific embodiments the oxide particle size is below about 1 micrometer.

In specific embodiments the 2212 multifilament superconducting wire has resistance sleeves comprises at least a second oxide layer. In specific embodiments the second oxide layer is less than about 3 micrometers thick.

In specific embodiments the 2212 multifilament superconducting wire has a cross-sectional area of between about 0.1 square millimeters and about 3 square millimeters.

In specific embodiments the 2212 multifilament superconducting wire has a cross-sectional area between about 0.05 and about 0.15 square millimeters.

In specific embodiments the 2212 multifilament superconducting wire has a cross sectional shape that is about round, square, oval, hexagonal or rectangular.

In specific embodiments the 2212 multifilament superconducting wire has a shape aspect of less than 4:1.

In specific embodiments the 2212 multifilament superconducting wire comprises at least two filaments. In specific embodiments the wire comprises at least eight filaments.

In specific embodiments the 2212 multifilament superconducting wire has a cross-sectional area fraction of silver is about 90 percent, or between about 80 percent to about 100 percent or between about 90 percent and about 100 percent. In specific embodiments the 2212 is from about 10 percent to about 50 percent.

In specific embodiments the 2212 multifilament superconducting wire has a critical current density of at least 50 kA/mm$^2$ at 4.2 K in a 5 T perpendicularly applied magnetic field.

The invention claimed is:

1. A method of producing a 2212 multifilament superconducting round or hexagonal-shaped wire comprising resistance sleeves, the method comprising:
    selecting a metal precursor to an oxide layer, the metal precursor being a precursor for each of the resistance sleeves for encasing a corresponding filament of a drawn multifilament wire;
    wrapping a first silver rod with the selected metal precursor and placing the first silver rod and the metal precursor into a silver tube comprising a multi-holed first billet;
    wrapping at least a second silver rod with the selected metal precursor and placing the at least the second silver rod and the metal precursor into the silver tube comprising the multi-holed first billet;
    applying a first heat to the billet;
    producing the drawn multifilament wire by wire drawing the multi-holed first billet into a bundle rod that is a round shape or a hexagonal shape as viewed along a cross-section; cutting the bundle rod into segments longitudinally;
    placing at least two of the segments within a second billet comprising either pure silver or a silver alloy;
    drawing down the second billet to a final diameter;
    twisting the round-shaped wire or the hexagonal-shaped wire about a longitudinal axis to a pitch of about 20 centimeters or less; and
    applying a second heat to the round-shaped wire or the hexagonal-shaped wire to oxidize the metal precursor film, forming the 2212 multifilament superconducting round or hexagonal-shaped wire comprising the resistance sleeves; and
    forming the multifilament superconducting round or hexagonal-shaped wire comprising the resistance sleeves into a cable.

2. The method of claim 1 wherein the step of applying the second heat further comprises raising the round-shaped wire or the hexagonal-shaped wire temperature to between about 400 degrees Celsius and about 900 degrees Celsius.

3. The method of claim 1 wherein the second heat is performed in an oxygen gas containing environment, with oxygen present with a partial pressure from about 0.2 atm to about 20 atm.

4. The method of claim 1 wherein the step of applying the second heat further comprises raising the round-shaped wire or the hexagonal-shaped wire temperature to between about 300 degrees Celsius and about 650 degrees Celsius in an oxygen gas containing environment, with oxygen present with a partial pressure from about 0.2 atm to about 5 atm.

5. The method of claim 1 wherein the step of twisting the round-shaped wire about a longitudinal axis to a pitch of about 20 centimeters or less comprises a pitch of from about 0 to about 5 cm.

6. The method of claim 1 wherein the selecting the metal precursor to the oxide layer comprises selecting aluminum, an aluminum alloy, magnesium, or a magnesium alloy.

7. The method of claim 1 wherein the selecting the metal precursor to the oxide layer comprises selecting at least one of Al—Li, Al—Mg, and Al—Ca.

8. The method of claim 1 further comprising forming the cable into a magnet for fusion development.

9. The 2212 multifilament superconducting square or oval wire of claim 8 wherein the wire has a shape aspect of less than 4:1.

10. A 2212 multifilament superconducting square or oval wire comprising resistance sleeves, the wire comprising:
    at least two filaments, each filament comprising 2212 regions separated from each other as seen on the wire cross-section;
    silver in between each of the 2122 regions and surrounding each of the 2122 regions;
    the resistance sleeves comprising an oxide, the resistance sleeves positioned between the silver and the 2122 regions such that each of the resistance sleeves surrounds one of the 2122 regions, the resistance sleeves extending substantially the entire length of each corresponding 2122 region; and
    wherein the superconducting square or oval wire comprising resistance sleeves forms a cable.

11. The 2212 multifilament superconducting square or oval wire of claim 10 wherein the effective resistivity of each of the resistance sleeves is greater than 0.0001 ohm cm at ambient temperature as well as from about 78 K to about 2 K.

12. The 2212 multifilament superconducting square or oval wire of claim 10 wherein each of the resistance sleeves is comprised of silver containing at least 0.1 volume percent of a dispersed oxide.

13. The 2212 multifilament superconducting square or oval wire of claim 10 wherein the oxide is at least one of $Al_2O_3$, MgO, or LiO, with oxide particle size below about 1 micrometer.

14. The 2212 multifilament superconducting square or oval wire of claim 10 wherein each of the resistance sleeves comprises at least a second oxide layer.

15. The 2212 multifilament superconducting square or oval wire of claim 10 wherein the second oxide layer is less than about 3 micrometers thick.

16. The 2212 multifilament superconducting square or oval wire of claim 10 wherein the wire has a cross-sectional area of between about 0.1 square millimeters and about 3 square millimeters.

17. The 2212 multifilament superconducting square or oval wire of claim 10 wherein the wire has a cross-sectional area between about 0.05 and about 0.15 square millimeters.

18. The 2212 multifilament superconducting square or oval wire of claim 10 wherein the at least two filaments comprise at least eight filaments.

19. The 2212 multifilament superconducting square or oval wire of claim 10 wherein the cross-sectional area fraction of silver ranges from about 80 percent to about 100 percent.

20. The 2212 multifilament superconducting square or oval wire of claim 10 wherein the cable forms a magnet for fusion development.

\* \* \* \* \*